(12) United States Patent
Chen

(10) Patent No.: US 6,987,669 B2
(45) Date of Patent: *Jan. 17, 2006

(54) AIR GUIDE FOR EQUIPMENT ENCLOSURE

(75) Inventor: Yancy Chen, Campbell, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/637,515

(22) Filed: Aug. 11, 2003

(65) Prior Publication Data

US 2004/0027804 A1    Feb. 12, 2004

Related U.S. Application Data

(60) Division of application No. 10/186,632, filed on Jul. 2, 2002, now Pat. No. 6,690,577, which is a continuation of application No. 10/180,082, filed on Jun. 27, 2002.

(51) Int. Cl.
    *H05K 7/20* (2006.01)
(52) U.S. Cl. .............. 361/695; 165/80.3; 165/121; 174/16.1; 361/697; 454/184
(58) Field of Classification Search ............. 62/259.2; 165/80.3, 121–126; 174/16.1, 15.1; 257/722, 257/718–719; 361/687–695, 715; 454/184
See application file for complete search history.

(56) References Cited

U.S. PATENT DOCUMENTS

| | | |
|---|---|---|
| 5,107,398 A | 4/1992 | Bailey |
| 5,422,787 A | 6/1995 | Gourdine |
| 5,497,825 A | 3/1996 | Yu |
| 5,566,377 A | 10/1996 | Lee |
| 5,917,697 A | 6/1999 | Wang |
| 6,113,485 A | 9/2000 | Marquis et al. |
| 6,148,907 A | 11/2000 | Cheng |
| 6,174,231 B1 | 1/2001 | Bodin |
| 6,256,197 B1 * | 7/2001 | Galis .......................... 361/687 |
| 6,282,090 B1 | 8/2001 | Johnson |
| 6,404,630 B1 * | 6/2002 | Lai ............................. 361/697 |
| 6,690,577 B2 * | 2/2004 | Chen .......................... 361/695 |

* cited by examiner

*Primary Examiner*—Gregory Thompson

(57) ABSTRACT

An equipment enclosure including a heat generating element and an adjustable air guide includes a first hollow element located adjacent to an aperture in a wall of an enclosure to allow air to pass freely there through. At least a first rigid adjustable rigid hollow pipe, a first hollow elbow, a second rigid adjustable hollow pipe, and a second hollow elbow are connected together in that order such that the first rigid hollow adjustable pipe is partially coextensive with and adjustably telescopes with the first hollow element and the first hollow elbow and second rigid hollow adjustable pipe is partially coextensive with and adjustably telescopes with the first and second hollow elbows such that the first and second rigid adjustable pipes have lengths which are effectively adjustable within a predetermined range. In addition, the rigid adjustable hollow pipes and hollow elbows and hollow first element may be arranged so as to rotate with respect to one another. A second hollow element is connected to the second elbow and is disposed adjacent to a heat-generating element and a heat-moving device is provided for moving air between the aperture and the heat-generating element.

6 Claims, 2 Drawing Sheets

AIR GUIDE FOR EQUIPMENT ENCLOSURE

RELATED APPLICATION

This application is a Divisional Under Rule 53(b) of application Ser. No. 10/186,632, filed on Jul. 2, 2002, now U.S. Pat. No. 6,690,577, entitled "Air Guide", which in turn is a Continuation Under Rule 53(b) of application Ser. No. 10/180,082, filed on Jun. 27, 2002, entitled "Air Guide", and priority is hereby claimed under 35 USC 120 based on these applications.

BACKGROUND OF THE INVENTION

Electronic equipment, such as personal computers, for example, are normally enclosed in equipment cabinets. Because the electronic components in such cabinets generate heat, to prevent overheating of the electronic components, arrangements are provided for removing the heat generated by such electronic components in the electronic equipment cabinets. Openings are commonly provided in the electronic equipment cabinets to allow the flow of air through the cabinets so as to remove the heat generated by the electronic components. A air moving device, such as a cooling fan, may be provided to increase the flow of air through the electronic equipment cabinets.

Due to the increased complexity and improved performance of various electronic components, such as the microprocessors included in personal computers, for example, the cooling arrangement for cooling the electronic equipment cabinets is often insufficient to remove the greater amounts of heat generated by such electronic components.

In view of the above, various techniques have been used to increase the flow of air around the electronic components which generate a greater amount of heat, to remove such greater amounts of generated heat. For example, U.S. Pat. No. 5,107,398 to Bailey, U.S. Pat. No. 5, 566,377 to Lee, U.S. Pat. No. 6,113,485 to Marquis et al. U.S. Pat. No. 6,174,231 to Bodin, and U.S. Pat. No. 6,289,090 to Johnson et al. each disclose arrangements to increase the flow of air around microprocessors, for example, to remove the greater amount of heat generated by such microprocessors. Air ducts and/or auxiliary cooling fans are used to remove the greater amount of heat generated by such microprocessors.

However, the above-noted arrangements must be custom-made for each particular application. That is, a computer manufacturer, for example, may manufacture several different models of personal computers, each having different motherboards. Each different motherboard may have its microprocessor requiring additional cooling mounted at a different location. Accordingly, it is necessary for the computer manufacturer to custom make such air duct/auxiliary cooling fan arrangements for each personal computer model. This results in higher design costs, manufacturing costs, and inventory costs in comparison utilizing a single air duct/ auxiliary cooling fan arrangement design for all of the personal computer models.

SUMMARY OF THE INVENTION

In one aspect of the invention, a method of adjusting an air guide to provide a flow of air to cool a heat generating element located in an enclosure includes: locating one end of a first hollow element adjacent to an aperture in a wall of the enclosure to allow air to pass freely between the aperture and another end of the first hollow element; connecting at least a first rigid hollow adjustable pipe, a first hollow elbow, a second rigid hollow adjustable pipe, and a second hollow elbow together in that order, one end of the first rigid hollow adjustable pipe partially coextensive with and adjustably telescoping the another end of the first element and one end of the first elbow and first and second ends of the second rigid hollow adjustable pipe partially coextensive with and adjustably telescoping another end of the first hollow elbow and one end of the second hollow elbow such that the first and second rigid adjustable hollow pipes have lengths which are effectively selectively adjustable within a predetermined range; connecting a second hollow element between another end of the second hollow elbow and the heat-generating element; locating an air moving device to move air between the aperture and the heat generating element via the adjustable air guide; and selectively adjusting the lengths of the first and second rigid adjustable hollow pipes to provide a flow of air from the second hollow element to the heat-generating element to cool the heat-generating element.

In another aspect of the present invention, an equipment enclosure, including a heat generating element and an adjustable air guide, includes a first hollow element located adjacent a wall of the enclosure and having one end adjacent to an aperture in said wall of said enclosure to allow air to pass freely therethrough; at least a first rigid hollow adjustable pipe, a first hollow elbow, a second rigid hollow adjustable pipe, and a second hollow elbow connected together in that order, said first rigid hollow adjustable pipe partially coextensive with and adjustably telescoping with another end of said first element and one end said first elbow and said second rigid hollow adjustable pipe partially coextensive with and adjustably telescoping with another end said first hollow elbow and one end of said second hollow elbow such that said first and second rigid hollow adjustable pipes have lengths which are effectively adjustable within a predetermined range; a second hollow element having one end connected to another end of said second hollow elbow and having another end located adjacent to a heat generating element; and an air-moving device to move air between said aperture of said wall of said enclosure and said heat-generating element.

In still another aspect of the invention, the at least first and second rigid hollow adjustable pipes and the elements adjacent thereto are arranged so as to rotate with respect to one another.

Lastly, in another aspect of the invention, the elements of the adjustable air guide are fixedly attached to one another after assembly thereof so as to prevent movement therebetween.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understand that the same is by way of illustration and example only and that the invention is not limited thereto. The spirit and scope of the present invention are limited only by the terms of the appended claims.

The following represents brief descriptions of the drawings, wherein.

DETAILED DESCRIPTION

Figure 1:
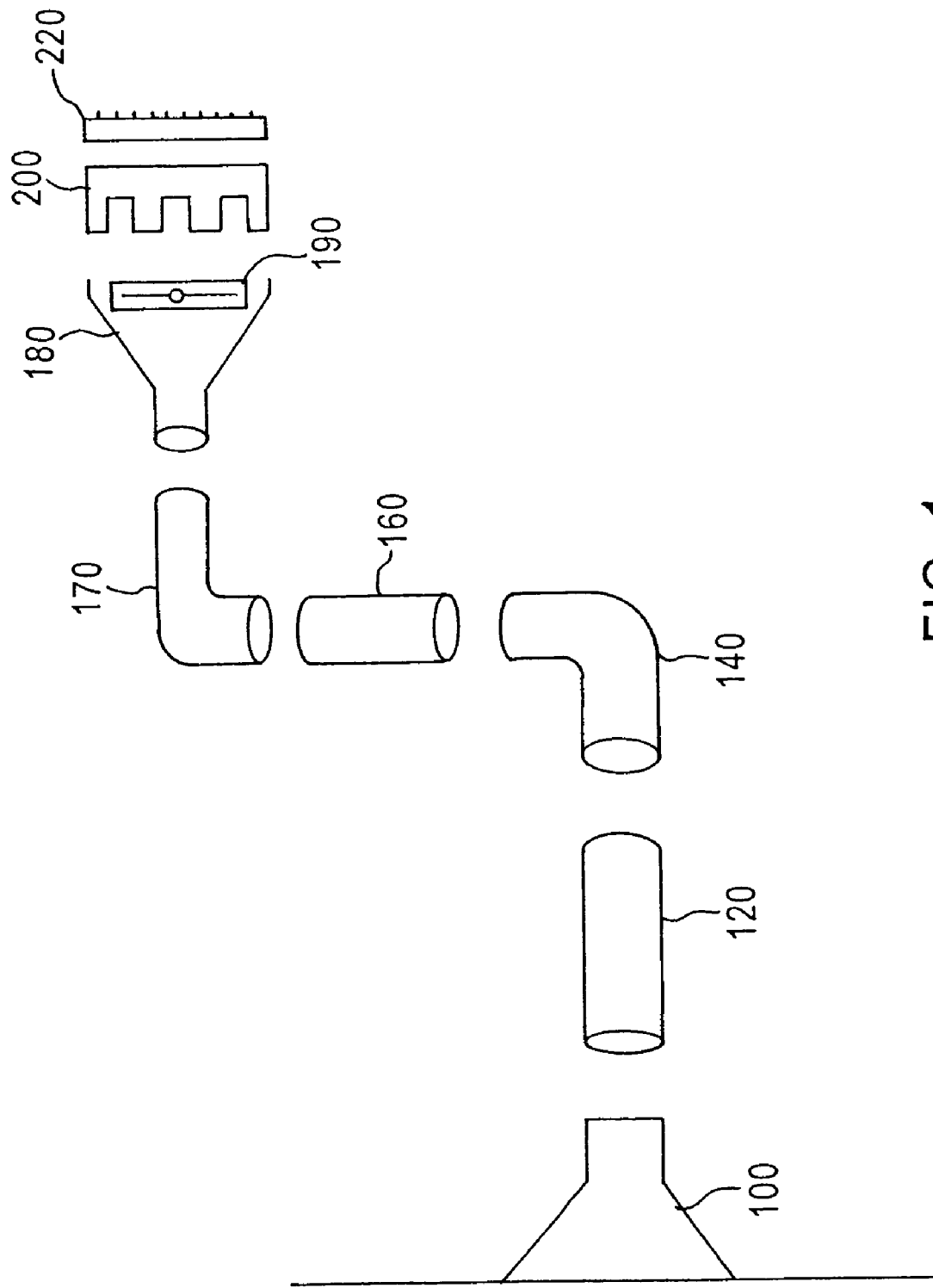
FIG. 1 is an exploded view of an equipment enclosure including an adjustable air guide in accordance with an example embodiment of the present invention utilizing 90 degree elbows and a fan located within the equipment enclosure.

Before beginning a detailed description of the subject invention, mention of the following is in order. When appropriate, like reference numerals and characters may be used to designate identical, corresponding, or similar components in different drawing figures. Furthermore, although the example embodiments specifically refer to cooling a microprocessor located in a personal computer cabinet, it is of course understood that the present invention is not limited thereto but may in fact be used with any heat generating component in any equipment cabinet.

U.S. Pat. No. 5,497,825 to Yu and U.S. Pat. No. 5,917,697 to Wang each disclose earlier disadvantageous CPU cooling arrangements which reduce the need to custom make air duct/auxiliary cooling fan arrangements for each personal computer model. Flexible bellows-type air ducts and auxiliary cooling fans are used to increase the flow of air around the microprocessors to remove the greater amount of heat generated by such microprocessors. However, such flexible bellows-type air ducts have many disadvantages. Namely, such air ducts can only be bent to a limited extent and accordingly, such air ducts may reduce but not eliminate the need to custom make air duct/auxiliary cooling fan arrangements for each personal computer model. Furthermore, such flexible bellows-type air ducts are more expensive to manufacture than standard rigid air ducts. Still furthermore, such flexible air ducts would require extra supporting structure to prevent them from moving freely inside the computer cabinet, thereby causing potential system failures during shock and vibration upon the flexible air ducts contacting sensitive electronic components within the computer cabinet. In addition, the flexible bellows-type air ducts may cause thermal issues due to excess material inside the computer cabinet obstructing the main flow of air through the cabinet. Lastly, in many applications, such air ducts must meet appropriate flame-rating standards, which may severely limit the choice of materials for such flexible bellows-type air ducts.

In an embodiment in accordance with the present invention, an adjustable air guide is added to the equipment enclosure to allow additional air to flow around the heat generating component located in the equipment enclosure and requiring additional cooling. This adjustable air guide may include a first hollow element, a first rigid hollow adjustable pipe, a first hollow elbow, a second rigid hollow adjustable pipe, a second hollow elbow and a second hollow element arranged in that order and further including an air moving device so as to allow air to freely pass through the adjustable air guide. The rigid hollow adjustable pipes have ends which are partially coextensive with corresponding ends of adjacent elements so as to adjustably telescope therewith and thereby have lengths which are effectively adjustable within a predetermined range. Furthermore, the rigid hollow adjustable pipes and the elements adjacent thereto may be rotatable with respect to one another. The configuration of this adjustable air guide may be adjusted to allow additional air flow over a heat generating component in the equipment enclosure requiring additional cooling, irrespective of the location of this heat generating component in the enclosure. In addition, the rigidity of the elements of this adjustable air guide obviate the need for additional support within the equipment enclosure. Furthermore, the adjustability of the air guide allows its use with different equipment models without requiring custom-made air guides for each model.

Referring to FIG. 1, a flared or funnel shaped hollow element 100 has one end affixed to a wall 110 of an equipment enclosure 105. An aperture (not shown) in the wall 110 of the equipment enclosure 105 allows air to pass freely between the space outside of the enclosure 105 and the element 100. Another end of the element 100 includes an aperture which mates with one end of a first rigid hollow adjustable pipe 120. The another end of the element 100 is partially coextensive with the one end of the first adjustable pipe 120. Another end of the first rigid hollow adjustable pipe 120 is mated to one end of a first 90 degree hollow elbow 140 having a second end which is in turn mated to one end of a second rigid hollow adjustable pipe 160. The another end of the first adjustable pipe 120 is partially coextensive with the one end of the first hollow elbow 140 and the second end of the hollow elbow 140 is partially coextensive with the one end of the second adjustable pipe 160. Another end of the second rigid hollow adjustable pipe 160 is mated to a first end of a second 90 degree hollow elbow 170 having another end which is in turn mated with one end of a fan enclosure 180 having a fan 190 disposed therein. The another end of the adjustable pipe 160 is partially coextensive with the first end of the elbow 170 and the another end of the elbow 170 is partially coextensive with the one end of the fan enclosure 180. The fan enclosure 180 and fan 190 are disposed adjacent to a microprocessor heat sink 200 which is thermally connected to a microprocessor 220.

The rigid hollow adjustable pipes 120 and 160 are designed so as to telescope with the 90 degree hollow elbows 140 and 170 and the element 100 such that their lengths are effectively adjustable within a predetermined range. That is, one end of the adjustable pipe 120 may adjustably telescope inside of one end of the elbow 140 so as to be more or less coextensive therewith, for example, thereby adjusting the effective length of the adjustable pipe 120. Furthermore, the rigid hollow adjustable pipes 120 and 160 and the 90 degree hollow elbows 140 and 170 and the element 100 may be arranged such that these elements can rotate with respect to one another.

While element 100 is shown as being a flared or funnel shaped hollow element, the present invention is not limited thereto in that other shapes for element 100 are possible. Furthermore, while the rigid hollow adjustable pipes 120 and 160 are shown as having a round cross-section, the present invention is not limited thereto in that pipes of other cross-sectional shapes, such as oval or rectangular, may be used. Still furthermore, while the hollow elbows 140 and 170 are shown as 90 degree elbows, the present invention is not limited thereto in that elbows having other angles, such as 30 or 45 or 60 degrees, may be used. In addition, if rigid hollow adjustable pipes having other than round cross-sectional shapes are used, swivel arrangements may be included with the elbows and flared element or the rigid hollow adjustable pipes to allow the rigid hollow adjustable pipes and hollow elbows and hollow flared element to rotate with respect to one another.

The elements illustrated in FIG. 1 may be fabricated of a metal, such as aluminum, copper, or steel. They also may be fabricated of a plastic, such as PVC. Various combinations of materials may also be used to fabricate the elements illustrated in FIG. 1.

One end of the flared element 100 is affixed to the wall 110 of the equipment enclosure 105 so that an aperture in the wall 110 of the equipment enclosure 105 is adjacent the one end of the flared element 100 to allow the free flow of air therethrough. The remaining elements, that is, the rigid hollow adjustable pipes 120 and 160 and hollow elbows 140 and 170 and the fan enclosure 180 and fan 190 are then assembled and adjusted until the fan enclosure 180 and fan 190 are properly disposed and the fan enclosure 180 and fan 190 may then be affixed to a mounting arrangement on the motherboard or equipment enclosure 105 to add rigidity to the resultant combination. Additional rigidity may also be added by fixedly attaching the elements together after assembly with a fixing means, such as bonding with an adhesive, welding or brazing or soldering, screwing or riveting, or using other bonding means.

A fan 190 has been shown as the air moving device. However, the present invention is not limited thereto in that other air moving devices, such as blowers or compressors may also be used. Furthermore, while the fan 190 has been shown as being within the fan enclosure 180 and adjacent to the heat sink 200, the present invention is not limited thereto in that the fan may be disposed outside of the enclosure, or just within the enclosure, or within any of the rigid adjustable pipes or elbows, or adjacent to the heat sink. Still furthermore, the heat sink 200 may be omitted in some arrangements or may be replaced by other heat transfer devices, such as heat pipes in other arrangements. In addition, while the fan enclosure 180 is shown as being flared or funnel shaped, the present invention is not limited thereto in that other shapes may also be used.

Figure 2:
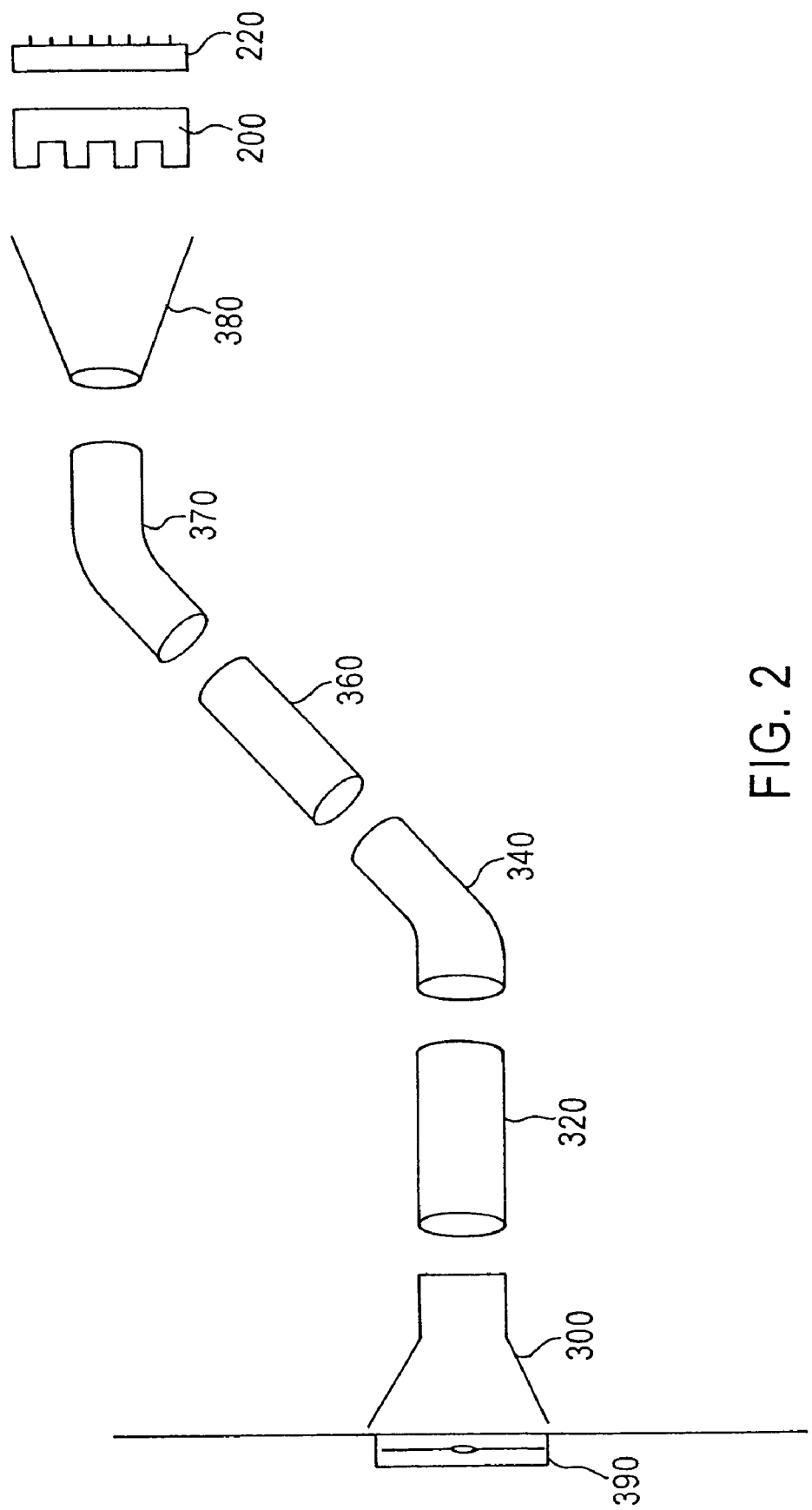
FIG. 2 is an exploded view of an equipment enclosure including an adjustable air guide in accordance with another example embodiment of the present invention utilizing 45 degree elbows and a fan located outside of the equipment enclosure.

FIG. 2 illustrates an exploded view of another example embodiment in accordance with the present invention. As illustrated therein, a fan 390 is disposed outside the wall 110 of the enclosure 105 with one end of a first flared element 300 disposed inside the wall 110 of the enclosure 105. There is an aperture (not shown) in the wall 110 of the enclosure 105 between the fan 390 and the one end of the first flared element 300 so as to allow air to freely pass there through.

A first rigid hollow adjustable pipe 320 is located between another end of the first flared element 300 and one end of a first 45 degree hollow elbow 340. Another end of the first 45 degree hollow elbow 340 is mated to one end of a second rigid hollow adjustable pipe 360 having another end which is in turn mated with one end of a second 45 degree hollow elbow 370. Another end of the second 45 degree hollow elbow 370 is mated with one end of a second flared element 380 having another end which is disposed adjacent to the heat sink 200 which is thermally connected to the microprocessor 220. One end of the first adjustable pipe 320 is partially coextensive with the another end of the flared element 300 and another end of the first adjustable pipe is partially coextensive with the one end of the elbow 340. Similarly, the one end of the second adjustable pipe 360 is partially coextensive with the another end of the first elbow 340 and the another end of the adjustable pipe 360 is partially coextensive with the one end of the elbow 370.

The rigid hollow adjustable pipes 320 and 360 are designed so as to telescope with the 45 degree hollow elbows 340 and 370 and the element 300 such that their lengths are effectively adjustable within a predetermined range. That is, one end of the adjustable pipe 320 may adjustably telescope inside of one end of the elbow 340 so as to be more or less coextensive therewith, for example, thereby adjusting the effective length of the adjustable pipe 320. Furthermore, the rigid hollow adjustable pipes 320 and 360 and the 45 degree hollow elbows 340 and 370 and the element 300 may be arranged such that these elements can rotate with respect to one another.

It is clear from FIGS. 1 and 2 that the use of adjustable rigid hollow pipes and elbows which allow rotation between the adjustable rigid hollow pipes and the elbows results in a configuration which allows tremendous design flexibility so as to allow a manufacturer to produce several different equipment models without having to custom make air guide arrangements for each model.

This concludes the description of the example embodiments. Although the present invention has been described with reference to a number of illustrative embodiments thereof, it should be enlisted that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings, and the appended claims without departing from the spirit of the invention. In addition to variations and modifications in the component parts and/or arrangements, alternative uses will be apparent to those skilled in the art.

What is claimed is:

1. An equipment enclosure including a heat generating element and an adjustable air guide, the enclosure comprising:

a first hollow element located adjacent a wall of the enclosure and having one end adjacent to an aperture in said wall of said enclosure to allow air to pass freely therethrough;

at least a first rigid hollow adjustable pipe, a first hollow elbow, a second rigid hollow adjustable pipe, and a second hollow elbow connected together in that order, said first rigid hollow adjustable pipe partially coextensive with and adjustably telescoping with another end of said first element and one end of said first hollow elbow and said second rigid hollow adjustable pipe partially coextensive with and adjustably telescoping with another end of said first hollow elbow and one end of said second hollow elbow such that said first and second rigid hollow adjustable pipes have lengths which are effectively adjustable within a predetermined range;

a second hollow element having one end connected to another end of said second hollow elbow and having another end located adjacent to a heat generating element; and an air-moving device to move air between said aperture of said wall of said enclosure and said heat-generating element.

2. The equipment enclosure of claim 1, wherein one of the at least first and second rigid hollow adjustable pipes comprises providing a rigid hollow adjustable pipe having one of a circular, an oval, and a rectangular cross-section.

3. The equipment enclosure of claim 1, wherein the first and second hollow elements and the at least first and second rigid hollow adjustable pipes and the first and second hollow elbows are fixed to prevent movement therebetween.

4. The equipment enclosure of claim 3, wherein fixed includes at least one of bonding with an adhesive, welding, brazing, soldering, screwing, and riveting.

5. The equipment enclosure of claim 1, wherein at least one of said at least first and second rigid hollow adjustable pipes has one of a circular, an oval, and a rectangular cross-section.

6. The equipment enclosure of claim 1, wherein said air moving device comprises one of a fan, a blower, and a compressor.

* * * * *